(12) United States Patent
Ho

(10) Patent No.: US 7,208,344 B2
(45) Date of Patent: Apr. 24, 2007

(54) WAFER LEVEL MOUNTING FRAME FOR BALL GRID ARRAY PACKAGING, AND METHOD OF MAKING AND USING THE SAME

(75) Inventor: Chi Shen Ho, Fremont, CA (US)

(73) Assignee: Aptos Corporation, Hsin-Chu (TW)

( * ) Notice: Subject to any disclaimer, the term of this patent is extended or adjusted under 35 U.S.C. 154(b) by 300 days.

(21) Appl. No.: 10/816,413

(22) Filed: Mar. 31, 2004

(65) Prior Publication Data

US 2005/0224968 A1    Oct. 13, 2005

(51) Int. Cl.
*H01L 21/00*    (2006.01)

(52) U.S. Cl. .................... 438/107; 438/125; 438/613; 257/E21.503

(58) Field of Classification Search ............... 257/676, 257/723, 737, 750; 438/123, 613, 106, 107, 438/125, 129, 599, 598
See application file for complete search history.

(56) References Cited

U.S. PATENT DOCUMENTS

| | | | | |
|---|---|---|---|---|
| 5,106,461 | A * | 4/1992 | Volfson et al. | 205/125 |
| 6,548,895 | B1 * | 4/2003 | Benavides et al. | 257/712 |
| 6,617,674 | B2 * | 9/2003 | Becker et al. | 257/678 |
| 6,825,553 | B2 * | 11/2004 | Chua et al. | 257/691 |
| 7,074,650 | B2 * | 7/2006 | Honda | 438/108 |
| 7,087,991 | B2 * | 8/2006 | Chen et al. | 257/700 |

* cited by examiner

*Primary Examiner*—Evan Pert
*Assistant Examiner*—Victor A. Mandala, Jr.
(74) *Attorney, Agent, or Firm*—Tung & Associates

(57) ABSTRACT

A method of forming a semiconductor package including placing a semiconductor chip in cavities of a semiconductor chip carrier substrate.

32 Claims, 4 Drawing Sheets

WAFER LEVEL MOUNTING FRAME FOR BALL GRID ARRAY PACKAGING, AND METHOD OF MAKING AND USING THE SAME

FIELD OF THE INVENTION

This invention relates to semiconductor packaging and methods of making and using the same.

BACKGROUND OF THE INVENTION

The driving force for the development of new packaging solutions is the development of new electronic devices. Such devices support the pervasive application of information technology including transmitters and receivers, wireless chip sets, high speed modems, microprocessors, memory, automobile, and aircraft avionics to mention a few that all enhance the lives of our society.

Traditional packaging technology has supported device protection and performance requirements have involved such substrates as dual in-line packaging (DIP) and quad flat package (QFP). In the vast majority of applications of this technology, a semiconductor chip is electrically connected to the package by wire bonding. The DIP uses pins to connect the packaged chip to the electronic system and these pins are inserted into a print circuit board or socket during assembly. The leads of the QFP are solder mounted on a surface of the printer circuit board rather than being inserted into the board as is the case with DIP. This surface mount technology (SMT) can support many more package to board leads than DIP in a much smaller "footprint" on the board. At about 250 leads, however, the increasing difficulty in manufacturing the QFP format has tended to establish a practical limit to its further extension to higher lead count. Accordingly, the industry has moved away from QFP to ball grid array format to support higher lead count.

FIG. 1 illustrates one embodiment of a prior art ball grid array which includes a semiconductor chip 12 that is attached to a carrier substrate 14, such as a laminate, by way of an adhesive 16. Wire bonds 18 are connected to bond pads (not shown) on the surface of a semiconductor chip 12 down to bond pads (not shown) on the carrier substrate 14. A first set of solder bump connectors 20 are provided on the underside of the carrier substrate which are typically used to attach the ball grid array to a print circuit board. An encapsulation layer 22 is also provided. FIG. 2 illustrates another embodiment of a ball grid array assembly 10, which also includes a chip semiconductor device 12 that is attached to the carrier substrate 14. However, in this embodiment, the semiconductor chip 12 is attached by a second set of semiconductor solder bumps 24 to bond pads on the upper surface of the carrier substrate 14. This embodiment also includes the first set of solder bump 20 connections on the underside of the carrier substrate 14 used to connect the ball grid array to a printer circuit board. This embodiment also may include an encapsulation 22 to protect the semiconductor device 12 and its electrical connections 24.

As the number of transistors in a chip increases, so must the number of chip bond pads needed to support them with power ground, clock and signal. Thus, as chip complexity increase, the practical limit for peripheral chip pads tend to be exceeded. Wire bonding technology has been extremely successful in supplying the chip-to-substrate interconnect at an affordable cost. However, peripheral wire bonding is limited in its pad count to about 900 pads on the chip. About 900 pads, the production problems associated with wire bonding begin to affect production throughput as well as yield. Ultimately, these problems equate to increased cost. Wire bonding is more applicable to peripherally bonded chips. With peripheral input/output connections, the voltage drop along the chips power and ground lines will impact the signal/noise immunity for medium and high powered chips. When circuits in the chip's interior are connected to those near the periphery, they will be affected by this voltage instability. For these reasons, it is necessary to adopt an area array configuration for high lead count chip-to-package interconnections. Array area interconnections allow cost-effective interconnect beyond the practical limits of wire bonding. The flip chip of ball grid array as shown in FIG. 2 is well accepted as an important vehicle for providing area array interconnect.

However, even the cheapest plastic ball grid array packages are generally slightly more expensive than their quad flat tech counterparts, especially for input/output numbers below 250 or so. The cost increase at package level may turn into an overall cost decrease at board level owing to potential higher assembly yields. However, ball grid array packages involving carrier substrates with more than two layers are likely to compete with quad flat pack costs at lower pin counts. The reasons for the higher cost of plastic ball grid arrays are to be found in mainly material costs of the high temperature BT epoxy substrate and the costs of the fine line circuitry technology required.

This invention provides improvements and alternatives to prior art ball grid array assemblies and methods of making the same.

SUMMARY OF THE INVENTION

One embodiment of the invention includes a method of making a semiconductor package comprising:

providing a semiconductor chip carrier substrate having a first surface and a plurality of cavities formed in the first surface and wherein each cavity is defined, at least in part, by a bottom surface and at least one sidewall;

placing an integrated circuit chip, having bond pads on an upper surface thereof, in each of the cavities formed in the chip carrier substrate, and wherein each semiconductor chip overlies the bottom surface;

forming a first dielectric layer over the first surface of the chip carrier substrate and over the integrated circuit chip in each of the cavities.

Another embodiment of the invention further comprising forming a first set of vias in the first dielectric layer and so that each one of the first set of vias is aligned with a bond pad of the integrated circuit chip.

Another embodiment of the invention further comprises forming an electrically conductive traces over the first dielectric layer and down into the vias formed in the first dielectric layer so that each one of the electrically conductive trace is electrically is connected to the one of the bond pads of the integrated circuit chip.

Another embodiment of the invention further comprises forming a second dielectric layer over the redistribution traces, and forming a second set of vias in the second dielectric layer so that each one of the second set of vias communicates with one of the redistribution traces.

Another embodiment of the invention further comprises forming electrically conductive bumps wherein each electrically conducted bump overlies the second dielectric layer and extends into one of the vias formed in the second dielectric layer and so that the electrically conductive bump is electrically connected to one of the redistribution traces.

Another embodiment of the invention further comprises sectioning the semiconductor chip carrier into individual packages each including a semiconductor chip.

In another embodiment of the invention the semiconductor chip carrier comprises at least one of silicone, glass, ceramic, and plastic.

In another embodiment of the invention the plurality of cavities are formed by etching a semiconductor chip carrier substrate.

In another embodiment of the invention the cavities are formed by molding the semiconductor circuit chip carrier substrate to provide the cavities.

In another embodiment of the invention the cavities are provided by milling a flat surface of a semiconductor chip carrier substrate.

Another embodiment of the invention further comprises depositing an adhesive over the bottom surface defining each cavity prior to placing the integrated circuit chip in each cavity.

In another embodiment of the invention the first set of vias formed in the first dielectric layer are formed by reactive ion etching.

In another embodiment of the invention the first dielectric layer comprises at least one of a polyimide and BCB.

In another embodiment of the invention the electrically conductive redistribution traces comprise copper.

In another embodiment of the invention the electrically conductive redistribution traces further comprise nickel.

In another embodiment of the invention the second dielectric layer comprises at least one of a polyimide and BCB.

In another embodiment of the invention the second set of vias is formed in the second dielectric layer by reactive ion etching.

In another embodiment of the invention the electrically conductive bumps are formed by at least one of ball placement, printing, and plating.

In another embodiment of the invention the sectioning comprises cutting the chip carrier substrate with a saw.

Another embodiment of the invention includes a semiconductor package comprising:

a wafer size semiconductor chip carrier substrate having a first surface and a plurality of cavities formed in the first surface and wherein each cavity is defined, at least in part, by a bottom surface and at least one sidewall;

an integrated circuit chip, having bond pads on an upper surface thereof, in each of the cavities formed in the wafer size chip carrier substrate, and wherein each semiconductor chip overlies the bottom surface;

a first dielectric layer over the first surface of the chip carrier substrate and over the integrated circuit chip in each of the cavities;

a first set of vias in the first dielectric layer and so that each of the first set of vias is aligned with a bond pad of the integrated circuit chip;

electrically conductive traces over the first dielectric layer and one of the traces extending down into the one of the vias formed in the first dielectric layer so that each one of the electrically conductive trace is electrically is connected to the one of the bond pads of the integrated circuit chip;

a second dielectric layer over the redistribution traces, and a second set of vias in the second dielectric layer so that each vias communicates with one of the redistribution traces;

electrically conductive bumps wherein each electrically conducted bump overlies the second dielectric layer and extends into one of the vias formed in the second dielectric layer and so that the electrically conductive bump is electrically connected to one of the redistribution traces.

In another embodiment of the invention the semiconductor chip carrier comprises at least one of silicone, glass, ceramic, and plastic.

Another embodiment of the invention further comprises an adhesive over the bottom surface defining each cavity and underlying the integrated circuit chip in each cavity.

In another embodiment of the invention the first dielectric layer comprises at least one of a polyimide and BCB.

In another embodiment of the invention the electrically conductive redistribution traces comprise copper.

In another embodiment of the invention the electrically conductive redistribution traces further comprise nickel.

In another embodiment of the invention the second dielectric layer comprises at least one of a polyimide and BCB.

These and other embodiments of the invention will be apparent from the following brief description of the drawings, detailed description of preferred embodiments and appended claims and drawings.

DETAILED DESCRIPTION OF PREFERRED EMBODIMENTS

Figure 1:
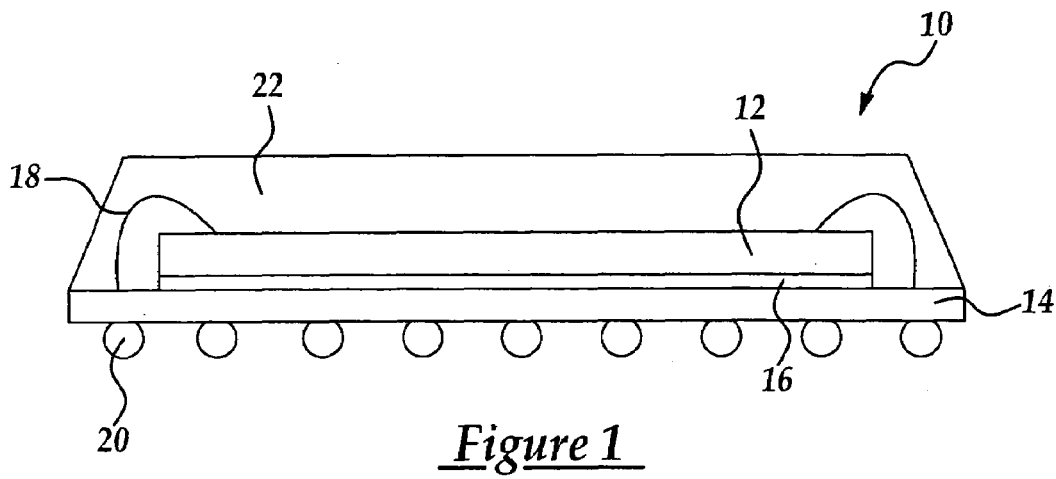
FIG. 1 illustrates a prior art ball grid array package utilizing wire bonding.
Figure 2:
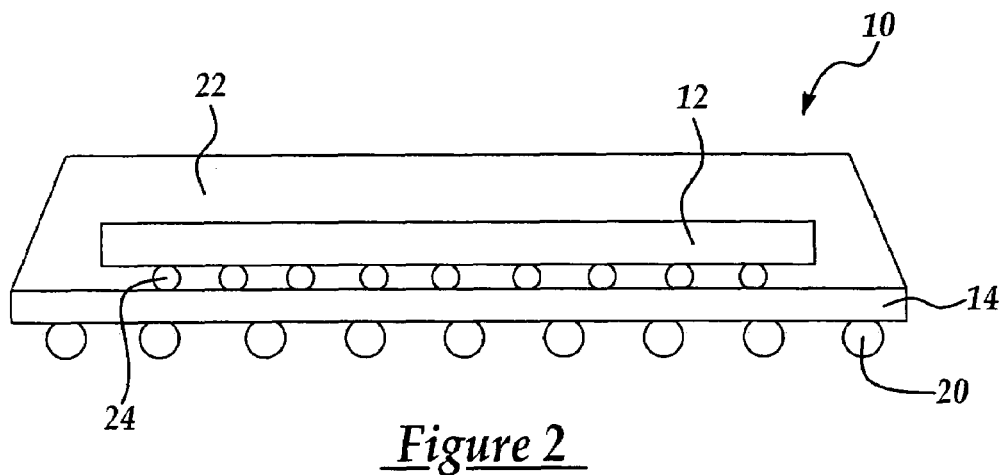
FIG. 2 illustrates a prior art ball grid array package using solder connections between the integrated circuit chip and the carrier substrate.
Figure 3A:
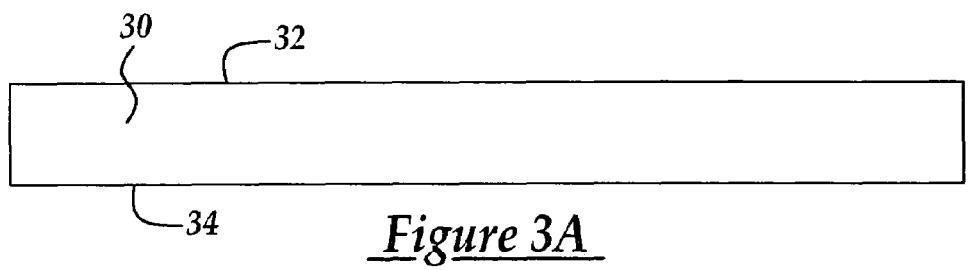
FIG. 3A illustrates a method according to the present invention including providing a wafer size chip carrier substrate.
Figure 3B:
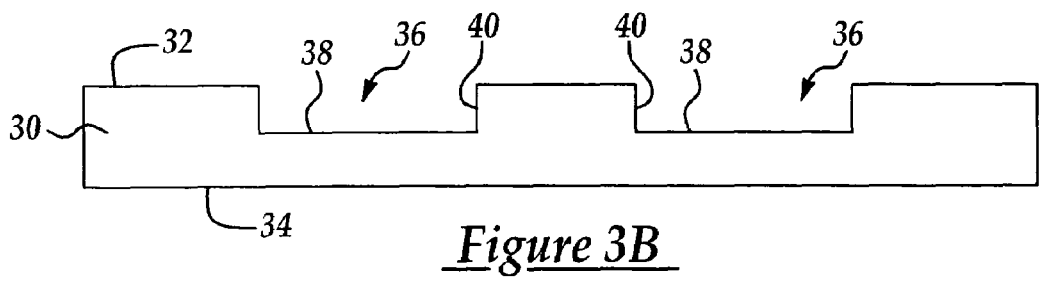
FIG. 3B illustrates a method according to one embodiment of the present invention, including forming cavities in the wafer size chip carrier substrate shown in FIG. 3A.

According to one embodiment of the invention, a wafer size chip carrier substrate 30 is provided as shown in FIG. 3A. However, chip carrier substrates small than wafer size may be utilized in another embodiment of the invention. The wafer size chip carrier substrate 30 includes a first surface 32 and an opposite second surface 34, both of which may be substantially flat. A plurality of cavities 36 are formed in the first surface 32 of the wafer size chip carrier substrate 30. The cavity 36 may be defined by a bottom surface 38 and at least one sidewall 40 as shown in FIG. 3D.

Figure 3C:
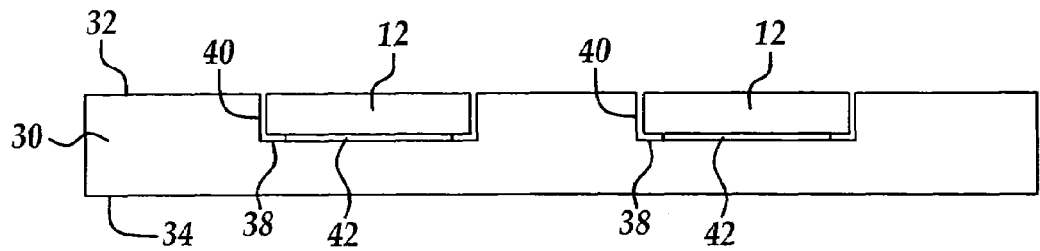
FIG. 3C illustrates a method according to the present invention including attaching a semiconductor dye in the cavity formed in the wafer size chip carrier substrate shown in FIG. 3B.

As shown in FIG. 3C, a semiconductor chip 12 may be placed in the cavity 36 overlying the bottom surface 38. Preferably, the semiconductor chip 12 is secured to the bottom surface 38. This may be accomplished by applying an adhesive 42 on the bottom surface 38 prior to placing the semiconductor chip 12 in the cavity 36. However, the semiconductor chip may be secured to the wafer size chip carrier substrate by any of a variety of means including sonic bonding or friction fit of a semiconductor chip in the cavity. Preferably, the adhesive 42 is a dielectric material having good thermal conductivity properties.

The wafer size semiconductor chip carrier substrate 30 (or mounting frame substrate) may be made of any material capable of being processed to form cavities therein. Such materials suitable for the wafer size chip carrier substrate 30 may include silicone, glass, ceramic, plastic, or other suitable materials for supporting a semiconductor substrate. The cavity 36 may be formed by depositing a photo resist patternization on top of the wafer size semiconductor chip carrier substrate followed by dry or wet etching to transfer the photoresist pattern to the substrate, thereby forming the cavities therein. Alternatively, the cavity 36 may be formed by molding the cavities into the substrate, or by machining or milling the cavities into the substrate.

Figure 3D:
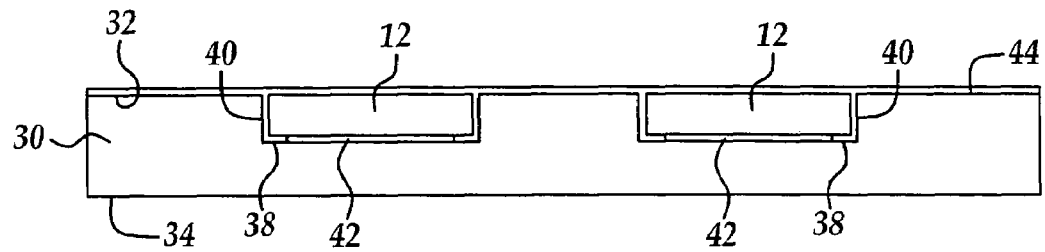
FIG. 3D illustrates a method according to one embodiment of the present invention, including forming a dielectric layer over the assembly shown in FIG. 3C.

As shown in FIG. 3D, a first dielectric layer 44 may be deposited over the wafer size chip carrier substrate 30 and the semiconductor chip 12 so that the first dielectric layer 44 flows down the sidewall 40 and onto the a portion of the bottom surface 38 if any space exists between the semiconductor chip and the sidewall 40 and the bottom surface 38 defined in the cavity 36. The first dielectric layer 44 may be applied using a bubble free coating process to obtain a substantially flat (planar) dielectric surface which preferably is at least 5 micrometers thick in the area overlying the first surface 32 of the wafer size chip carrier substrate 30. The first dielectric material 44 may be any dielectric including a polyimide or BCB. In a preferred embodiment, the cavity 36 is formed to have a depth of 125 µm, a width and length of 500 µm to receive the semiconductor chip, and the adhesive 42, such as epoxy, may have a thickness of about 20 µm.

Figure 3E:
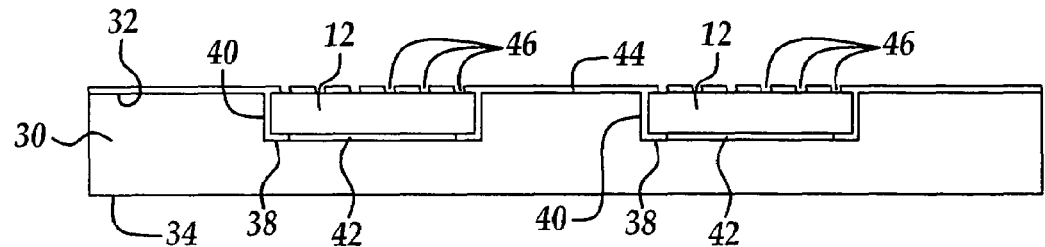
FIG. 3E illustrates a method according to one embodiment of the invention including forming vias in the dielectric layer shown in FIG. 3D.
Figure 4:
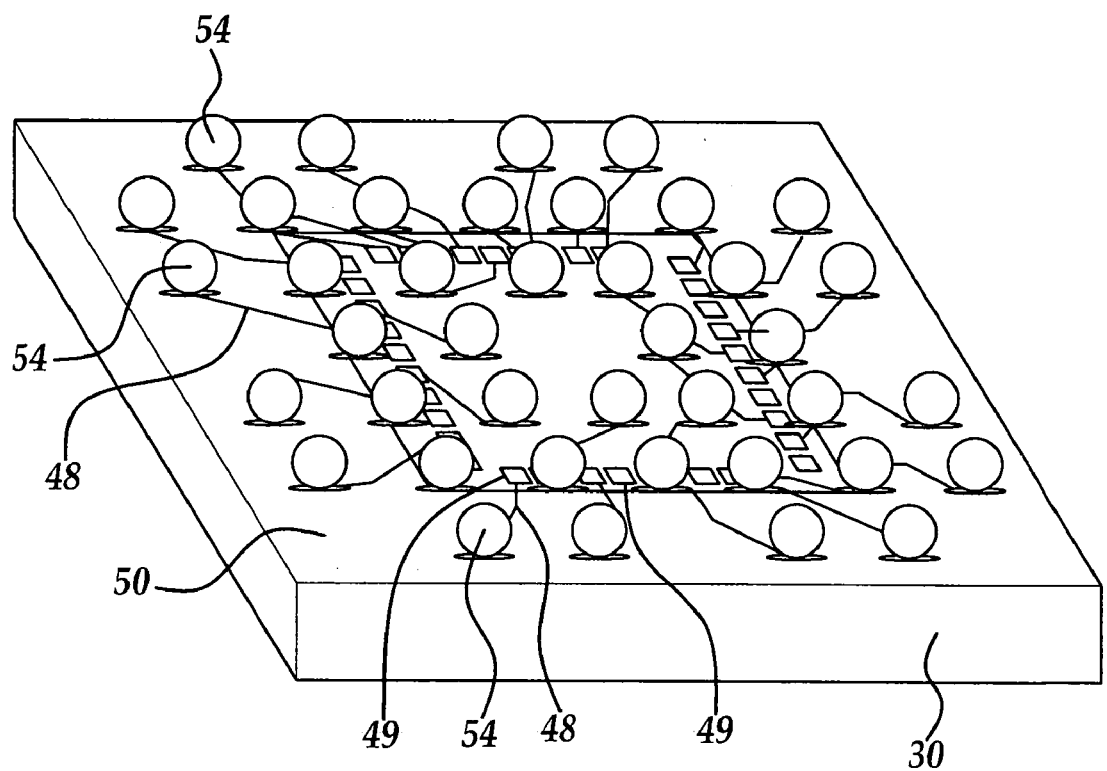
FIG. 4 illustrates one embodiment of a ball grid array package according to the present invention.

As shown in FIG. 3E, a first set of vias 46 are formed in the first dielectric layer 44 and preferably aligned with bond pads 49 on the semiconductor chip 12. The bond pads 49 can be best seen in FIG. 4. The first set of vias 46 can be formed by standard methods including photoresist patternization followed by etching which may be either dry or wet, or by other suitable methods.

Figure 3F:
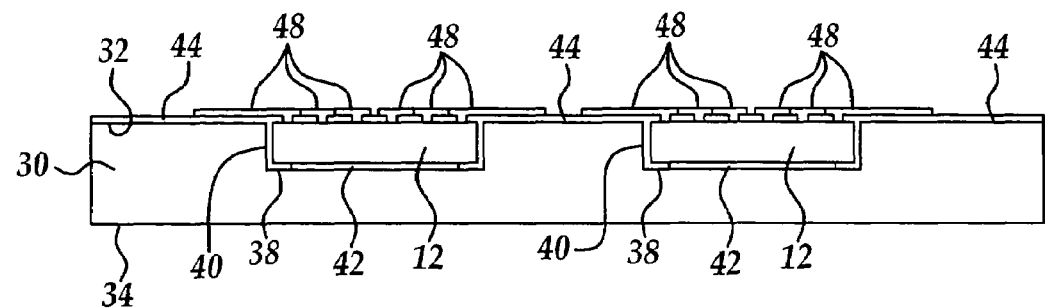
FIG. 3F illustrates a method according to one embodiment of the present invention, including selectively depositing electrically conducted traces and patterning the same over the assembly shown in FIG. 3E.

As shown in FIG. 3F, electrically conducted redistribution traces may be formed by depositing an electrically conducted material over the first dielectric layer 44 and down into the first set of vias 46 to make electrical contact to the bond pads 49 on the semiconductor chip 12. The electrically conducted layer may be patterned into electrically conducted redistribution traces 48 using standard photoresist patternization and etching techniques known to those skilled in the art. The electrical redistribution trace 48 may be formed by any manner known to those skilled in the art, including sputtering, plasma vapor deposition, or plating.

Figure 3G:
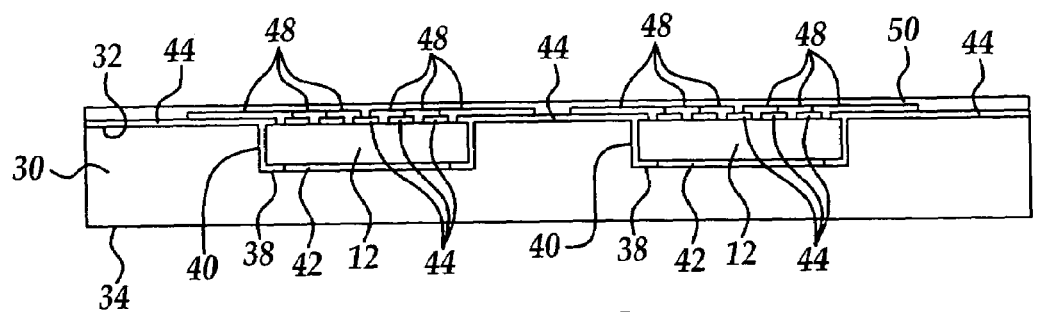
FIG. 3G illustrates one embodiment of the method according to the present invention, including providing a dielectric layer over the assembly shown in FIG. 3F.
Figure 3H:
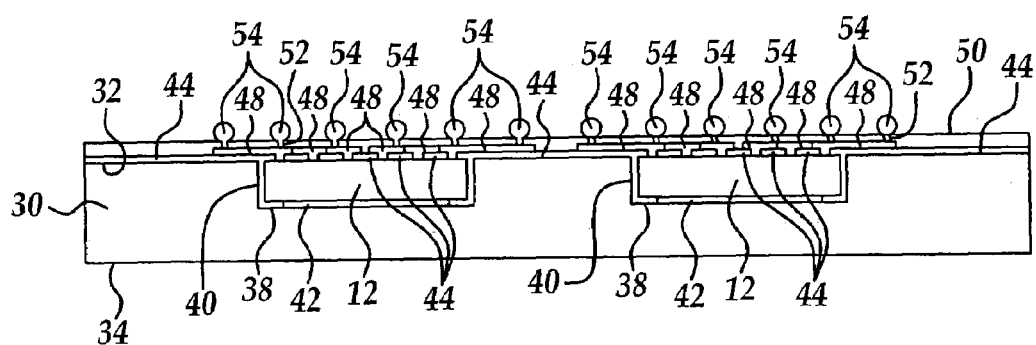
FIG. 3H illustrates one embodiment of a method according to the present invention including forming vias in the dielectric layer shown in FIG. 3G and depositing electrically conducted bumps over the vias.

As shown in FIG. 3G, a second (top) dielectric layer 50 is deposited over the assembly shown in FIG. 3F to provide a substantially planar surface overlying the electrically redistribution traces 48. The second dielectric layer 50 may be made of any suitable material known to those skilled in the art, including spin-on polyimide or BCB. As shown in FIG. 3E, a second set of vias 52 are formed in the second dielectric layer 50 wherein each via 52 is aligned with an associated redistribution trace 48. The second set of vias 52 may be formed by standard photoresist patternization and etching techniques known to those skilled in the art. Thereafter, electrically conductive bumps 54, for example, solder, gold, silver, nickel, tin containing bumps, are formed on the assembly with each solder bond extending through the vias 52 formed in the second dielectric layer 50 and makes electrical connection to the redistribution trace 48. Additional metallization layers may be interposed between the electrically conductive bump 54 and the redistribution trace 48. The electrically conductive bump 54 may be formed by any manner formed to those skilled in the art, including, for example but not limited to, placing balls over the vias 52, stenciling, or plating and subsequent reflow.

Figure 3I:
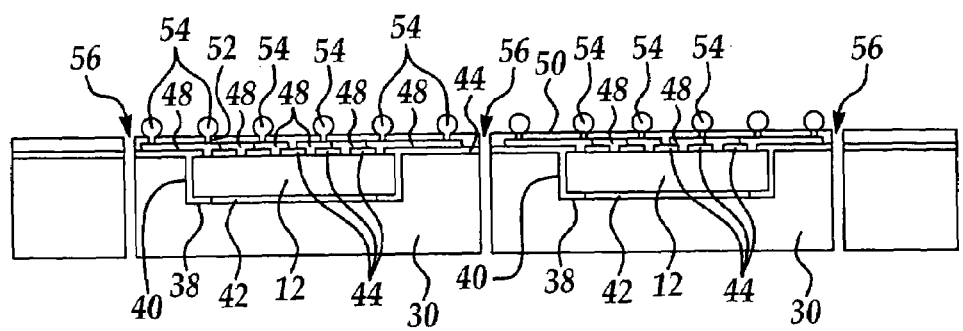
FIG. 3I illustrates one embodiment of a method according to the present invention, including dicing or sectioning the wafer size chip carrier substrate to provide individual ball grid array packages according to the present invention.

As shown in FIG. 3I, troughs 56 are formed through the wafer size chip carrier substrate to section individual semiconductor chips 12 from each other forming an individual or singulated ball grid array semiconductor chip package according to the present invention.

The invention claimed is:

1. A method of making a semiconductor package comprising;

provididng a semiconductor chip carrier substrate, having a first surface and a plurality of cavities formed in the first surface and wherein each cavity is defined, at least in part, by a bottom surface and at least one sidewall;

placing an integrated circuit chip, having bond pads on an upper surface thereof, in each of the cavities formed in the chip carrier substrate, and wherein each semiconductor chip overlies the bottom surface;

forming a first dielectric layer over the first surface of the chip carrier substrate and over the integrated circuit chip in each of the cavities wherein the first dielectric layer comprises at least one of a polyimide and BCB;

forming a first set of vias in the first dielectric layer and so that each of the first set of vias is aligned with a respective bond pad of the integrated circuit chip;

forming electrically conductive traces over the first dielectric layer and so that each one of the electrically conductive traces is electrically connected to at least one of the bond pads of the integrated circuit chip; and, forming a second dielectric layer comprising at least one of a polyimide and BCB over the redistribution traces, and forming a second set of vias in the second dielectric layer so that each of the second set of vias communicates with one of the redistribution traces; and, forming electrically conductive bumps by reflow wherein each electrically conductive bump overlies the second dielectric layer and comprises an unrounded portion extending into one of the vias formed in the second dielectric layer and so that the electrically conductive bump is electrically connected to one of the redistribution traces.

2. A method as set forth in claim 1 further comprising sectioning the semiconductor chip carrier into individual packages each including a semiconductor chip.

3. A method as set forth in claim 1 wherein the semiconductor chip carrier comprises at least one of silicone, glass, ceramic, and plastic.

4. A method as set forth in claim 1 wherein the plurality of cavities are formed by etching a semiconductor chip carrier substrate.

5. A method as set forth in claim 1 wherein the cavities are formed by molding the semiconductor circuit chip carrier substrate to provide the cavities.

6. A method as set forth in claim 1 wherein the cavities are provided by milling a flat surface of a semiconductor chip carrier substrate.

7. A method as set forth in claim 1 further comprising depositing an adhesive over the bottom surface defining each cavity prior to placing the integrated circuit chip in each cavity.

8. A method as set forth in claim 1 wherein the first set of vias formed in the first dielectric layer are formed by reactive ion etching.

9. A method as set forth in claim 1 wherein the electrically conductive redistribution traces comprise copper.

10. A method as set forth in claim 9 wherein the electrically conductive redistribution traces further comprise nickel.

11. A method as set forth in claim 1 wherein the second set of vias is formed in the second dielectric layer by reactive ion etching.

12. A method as set forth in claim 1 wherein the electrically conductive bumps are formed by at least one of ball placement, stenciling, and plating.

13. A method as set forth in claim 2 wherein the sectioning comprises cutting the chip carrier substrate with a saw.

14. The method of claim 1, wherein the semiconductor chip carrier substrate is selected from the group consisting of silicone and plastic.

15. A method of making a semiconductor package comprising:
providing a wafer size semiconductor chip carrier substrate having a first surface and a plurality of cavities formed in the first surface and wherein each cavity is defined, at least in part, by a bottom surface and at least one sidewall, said semiconductor chip carrier substrate selected from the group consisting of silicone and plastic;
placing an integrated circuit chip, having bond pads on an upper surface thereof, in each of the cavities formed in the wafer size chip carrier substrate, and wherein each semiconductor chip overlies the bottom surface;
forming a first dielectric layer over the first surface of the chip carrier substrate and over the integrated circuit chip in each of the cavities wherein the first dielectric layer comprises at least one of a polyimide and BCB;
forming a first set of vias in the first dielectric layer and so that each of the first set of vies is aligned with a respective bond pad of the integrated circuit chip;
forming an electrically conductive layer over the first dielectric layer and down into the vias formed in the first dielectric layer and selectively removing portions of the electrically conductive layer to form electrically conductive traces and so that each one of the electrically conductive traces is electrically connected to at least one of the bond pads of the integrated circuit chip;
forming a second dielectric layer comprising at least one of a polyimide and BCB over the redistribution traces, and forming a second set of vias in the second dielectric layer so that each of the second set of vias communicates with one of the redistribution traces;
forming electrically conductive bumps by reflow wherein each electrically conductive bump overlies the second dielectric layer and comprises an unrounded portion extending into one of the vias formed in the second dielectric layer and so that the electrically conductive bump is electrically connected to one of the redistribution traces; and,
sectioning the semiconductor chip carrier substrate into individual packages each including a semiconductor chip.

16. A method as set forth in claim 15 wherein the plurality of cavities are formed by etching a semiconductor chip carrier substrate.

17. A method as set forth in claim 15 wherein the cavities are formed by molding the semiconductor circuit chip carrier substrate to provide the cavities.

18. A method as set forth in claim 15 wherein the cavities are provided by milling a flat surface of a semiconductor chip carrier substrate.

19. A method as set forth in claim 15 further comprising depositing an adhesive over the bottom surface defining each cavity prior to placing the integrated circuit chip in each cavity.

20. A method as set forth in claim 15 wherein the first set of vias formed in the first dielectric layer are formed by reactive ion etching.

21. A method as set forth in claim 15 wherein the electrically conductive redistribution traces comprise copper.

22. A method as set forth in claim 21 wherein the electrically conductive redistribution traces further comprise nickel.

23. A method as set forth in claim 15 wherein the second set of vias is formed in the second dielectric layer by reactive ion etching.

24. A method as set forth in claim 15 wherein the electrically conductive bumps are formed by at least one of ball placement, printing, and plating.

25. A method as set forth in claim 15 wherein the sectioning comprises cutting the chip carrier substrate with a saw.

26. The method of claim 15, wherein the semiconductor chip carrier substrate is selected from the group consisting of silicone and plastic.

27. A semiconductor package comprising:
a semiconductor chip carrier substrate having a first surface and a plurality of cavities formed in the first surface and wherein each cavity is defined, at least in part, by a bottom surface and at least one sidewall;
an integrated circuit chip, having bond pads on an upper surface thereof, in each of the cavities formed in the chip carrier substrate, and wherein each semiconductor chip overlies the bottom surface;
a first dielectric layer over the first surface of the chip carrier substrate and over the integrated circuit chip in each of the cavities wherein the first dielectric layer comprises at least one of a polyimide and BCB;
a first set of vias in the first dielectric layer and so that each via is aligned with a respective bond pad of the integrated circuit chip;
electrically conductive traces over the first dielectric layer one of the traces extending down into one of the vias formed in the first dielectric layer so that each one of the electrically conductive traces is electrically connected to at least one of the bond pads of the integrated circuit chip;
a second dielectric layer over the redistribution traces, and a second set of vias in the second dielectric layer so that each of the second set of vias communicates with one of the redistribution traces, wherein the second dielectric layer comprises at least one of a polyimide and BCB;

electrically conductive bumps wherein each electrically conductive bump overlies the second dielectric layer and comprises an unrounded portion extending into one of the vias formed in the second dielectric layer and so that the electrically conductive bump is electrically connected to one of the redistribution traces.

28. A semiconductor package as set forth in claim 27 wherein the semiconductor chip carrier comprises at least one of silicone, glass, ceramic, and plastic.

29. A semiconductor package as set forth in claim 27 further comprising an adhesive over the bottom surface defining each cavity and underlying the integrated circuit chip in each cavity.

30. A semiconductor package as set forth in claim 27 wherein the electrically conductive redistribution traces comprise copper.

31. A semiconductor package as set forth in claim 30 wherein the electrically conductive redistribution traces further comprise nickel.

32. A semiconductor package as set forth in claim 27 wherein the semiconductor chip carrier substrate is selected from the group consisting of silicone and plastic.

* * * * *